(12) United States Patent
Snyder

(10) Patent No.: US 12,075,600 B1
(45) Date of Patent: Aug. 27, 2024

(54) FANLESS COMPUTER CASE

(71) Applicant: Anthony Lane Snyder, Bellingham, WA (US)

(72) Inventor: Anthony Lane Snyder, Bellingham, WA (US)

( * ) Notice: Subject to any disclaimer, the term of this patent is extended or adjusted under 35 U.S.C. 154(b) by 229 days.

(21) Appl. No.: 17/861,139

(22) Filed: Jul. 8, 2022

Related U.S. Application Data

(60) Provisional application No. 63/219,721, filed on Jul. 8, 2021.

(51) Int. Cl.
*H05K 7/20* (2006.01)
*G06F 1/20* (2006.01)

(52) U.S. Cl.
CPC ........... *H05K 7/20418* (2013.01); *G06F 1/20* (2013.01); *H05K 7/20436* (2013.01); *H05K 7/20445* (2013.01); *H05K 7/20509* (2013.01)

(58) Field of Classification Search
None
See application file for complete search history.

(56) References Cited

U.S. PATENT DOCUMENTS

| | | | | |
|---|---|---|---|---|
| 7,616,437 B2* | 11/2009 | Chang | ..................... | G06F 1/187 248/680 |
| 7,773,378 B2* | 8/2010 | Lin | ..................... | H05K 7/20409 361/721 |
| 9,320,167 B2* | 4/2016 | Wang | ..................... | H05K 7/142 |
| 10,616,993 B1* | 4/2020 | Gawlowski | .......... | H05K 1/0203 |
| 10,691,184 B1* | 6/2020 | Ganta Papa Rao Bala | .................. | G06F 1/181 |
| 2005/0030719 A1* | 2/2005 | Lin | ..................... | H05K 7/20445 361/719 |
| 2007/0242425 A1* | 10/2007 | Van Den Berg | ........ | G06F 1/181 361/679.54 |
| 2010/0128432 A1* | 5/2010 | Miller | ..................... | G06F 1/20 361/679.54 |
| 2010/0263851 A1* | 10/2010 | Yasui | ................... | H05K 7/2049 165/185 |
| 2016/0299545 A1* | 10/2016 | May | ....................... | G06F 1/187 |

* cited by examiner

*Primary Examiner* — Zachary Pape
*Assistant Examiner* — Steven Ngo
(74) *Attorney, Agent, or Firm* — Plager Schack LLP; Mark H. Plager; Michael J. O'Brien

(57) ABSTRACT

A fanless computer case assembly is configured to distribute heat from a computer through a thermal accessory. The fanless computer case assembly includes a fanless computer case that has a bottom cover joined to a front panel and a rear panel. A top cover is joined to the front panel and the rear panel. A mother board includes a central processing unit is arranged between the front panel and the rear panel. An upper CPU mounting plate and a lower CPU mounting plate are joined to the central processing unit. A base plate is attached to the upper CPU mounting plate and the top cover with a spacer creating an air gap between the base plate and the top cover. A first heat transfer plate is attached to the lower CPU mounting plate and the bottom cover.

4 Claims, 5 Drawing Sheets

FANLESS COMPUTER CASE

RELATED APPLICATION

This application claims priority to provisional patent application U.S. Ser. No. 63/219,721 filed on Jul. 8, 2021, the entire contents of which is herein incorporated by reference.

BACKGROUND

The embodiments herein relate generally to computer hardware.

Prior to embodiments of the disclosed invention, there was difficulty managing heat in high performance small form factor computers especially when a user desired quiet operation, embodiments of the disclosed invention solve this problem.

SUMMARY

A fanless computer case assembly is configured to distribute heat from a computer through a thermal accessory. The fanless computer case assembly includes a fanless computer case that has a bottom cover joined to a front panel and a rear panel. A top cover is joined to the front panel and the rear panel. A mother board includes a central processing unit is arranged between the front panel and the rear panel. An upper CPU mounting plate and a lower CPU mounting plate are joined to the central processing unit. A base plate is attached to the upper CPU mounting plate and the top cover with a spacer creating an air gap between the base plate and the top cover. A first heat transfer plate is attached to the lower CPU mounting plate and the bottom cover.

Heat from the central processing unit transfers through the lower CPU mounting plate, is spread across the first heat transfer plate through the bottom cover, and through the thermal accessory. A second heat transfer plate is joined to the bottom cover with a spacer, and further connected to RAM and an SSD joined to the motherboard; wherein heat from the RAM and the SSD is transferred to the second heat transfer plate and through the thermal accessory.

The thermal accessory can be a desk attached to the fanless computer case. Alternately, the thermal accessory can be a shelf attached to the fanless computer case

BRIEF DESCRIPTION OF THE FIGURES

The detailed description of some embodiments of the invention is made below with reference to the accompanying figures, wherein like numerals represent corresponding parts of the figures.

DETAILED DESCRIPTION OF CERTAIN EMBODIMENTS

Figure 1:
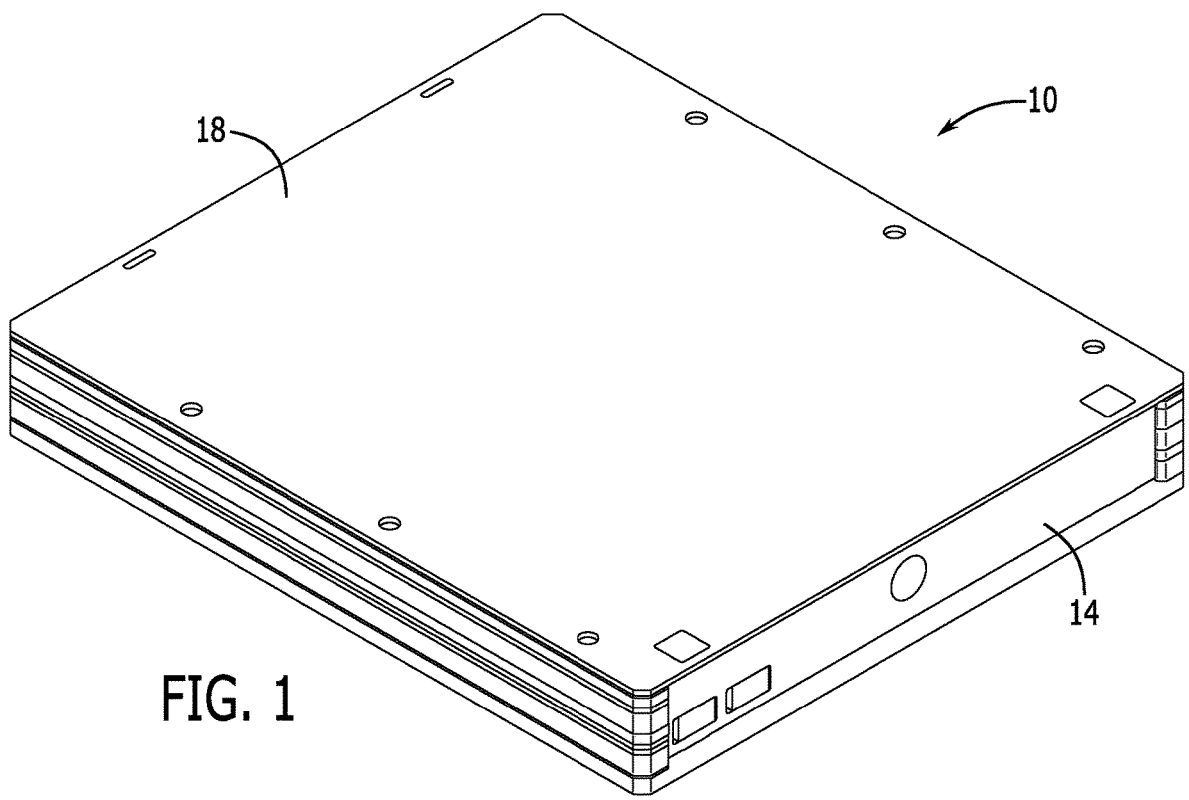
FIG. 1 shows a top perspective view of one embodiment of the present invention.
Figure 2:
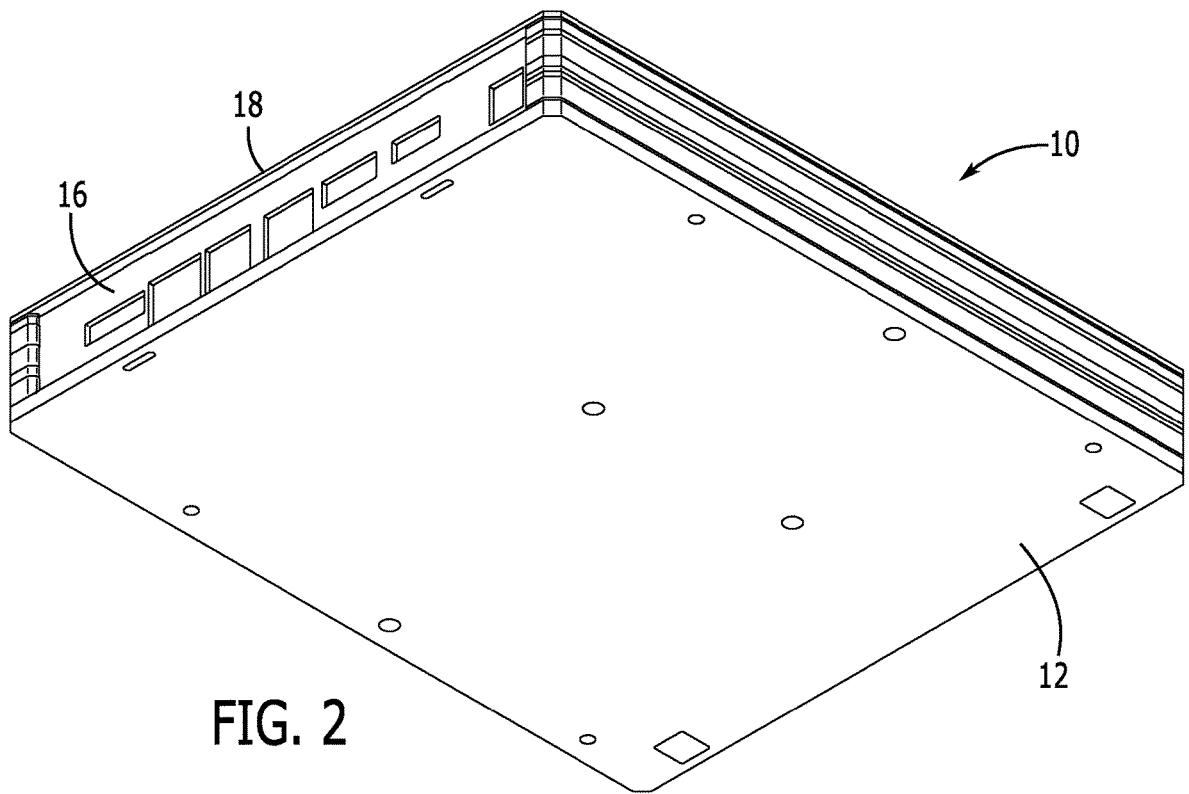
FIG. 2 shows a bottom perspective view of one embodiment of the present invention.
Figure 3:
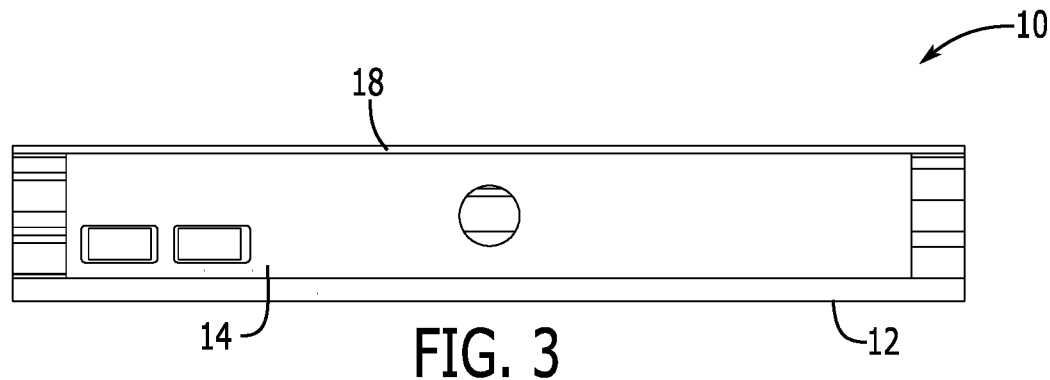
FIG. 3 shows a front elevation view of one embodiment of the present invention.
Figure 4:
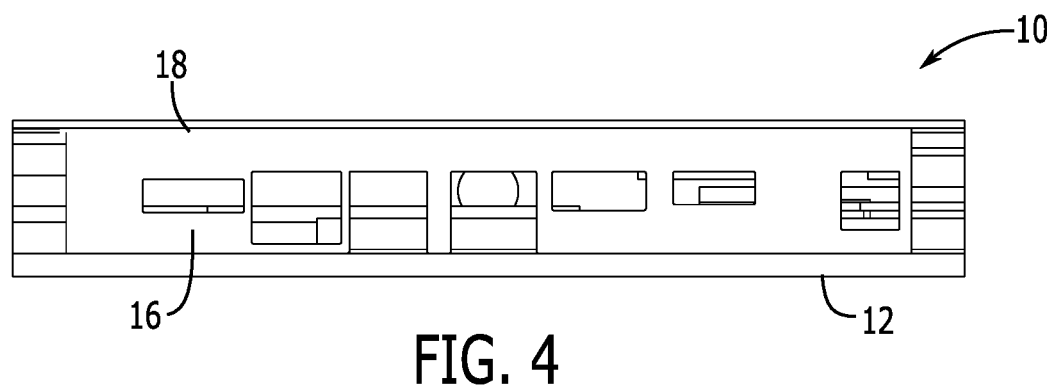
FIG. 4 shows a rear elevation view of one embodiment of the present invention.
Figure 5:
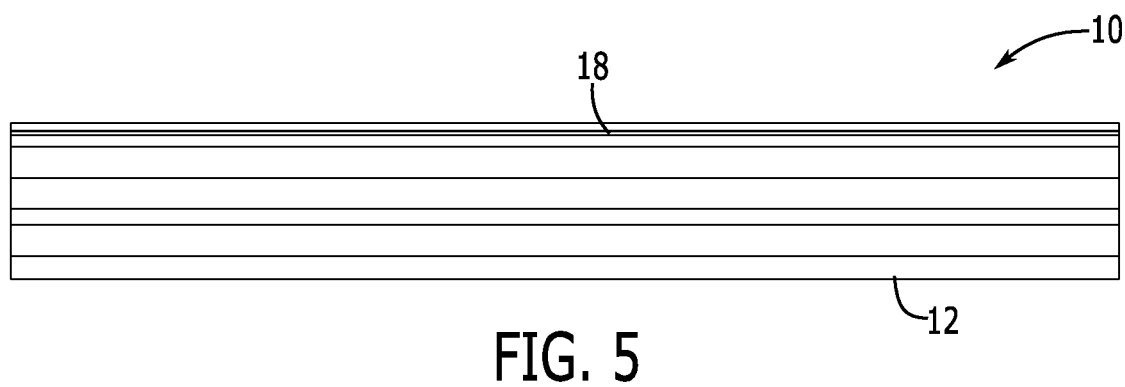
FIG. 5 shows a side elevation view of one embodiment of the present invention.

By way of example, and referring to FIGS. 1-9, one embodiment of a fanless computer case 10 comprises a bottom cover 12 joined to a front panel 14 and a rear panel 16. A mother board 17 is arranged between the front panel 14 and the rear panel 16.

The mother board further comprising a CPU 17 is joined to an upper CPU mounting plate 19 and a lower CPU mounting plate 21. The upper CPU mounting plate 19 and the lower CPU mounting plate 21 are made from copper such as copper 110.

The base plate 20 is attached to the top cover 18 with a spacer 22 creating an air gap between the base plate 20 and the top cover 18.

Figure 6:
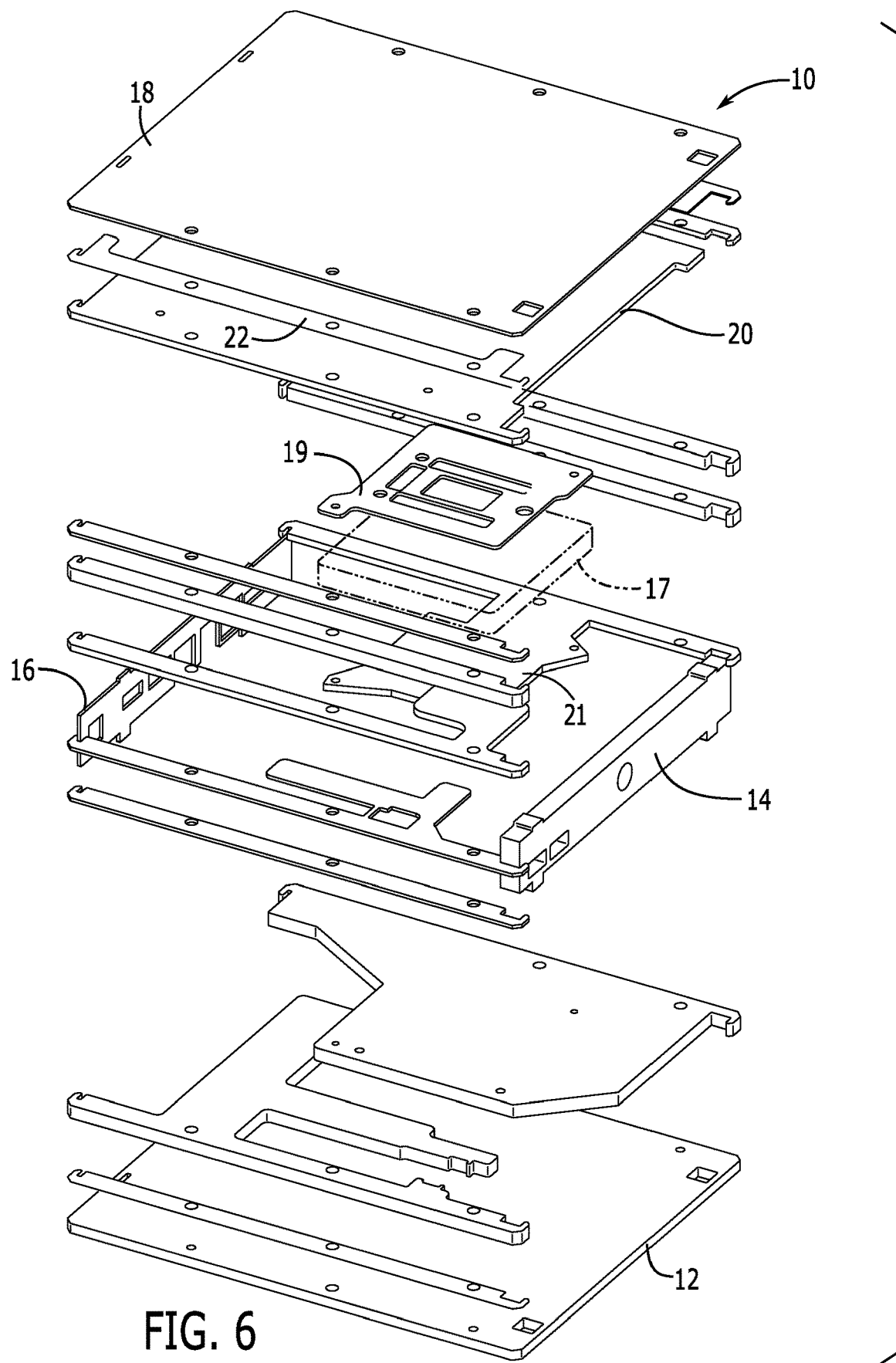
FIG. 6 shows an exploded view of one embodiment of the present invention.
Figure 7:
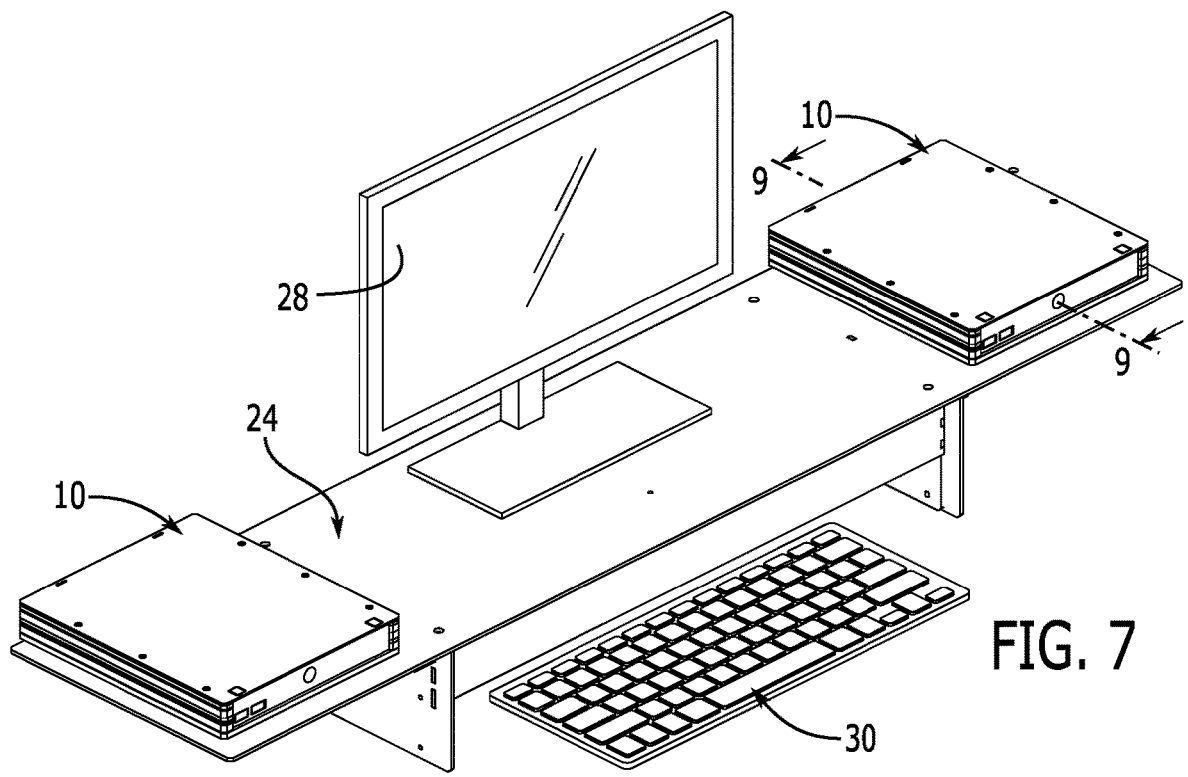
FIG. 7 shows a perspective view of one embodiment of the present invention shown in use.
Figure 8:
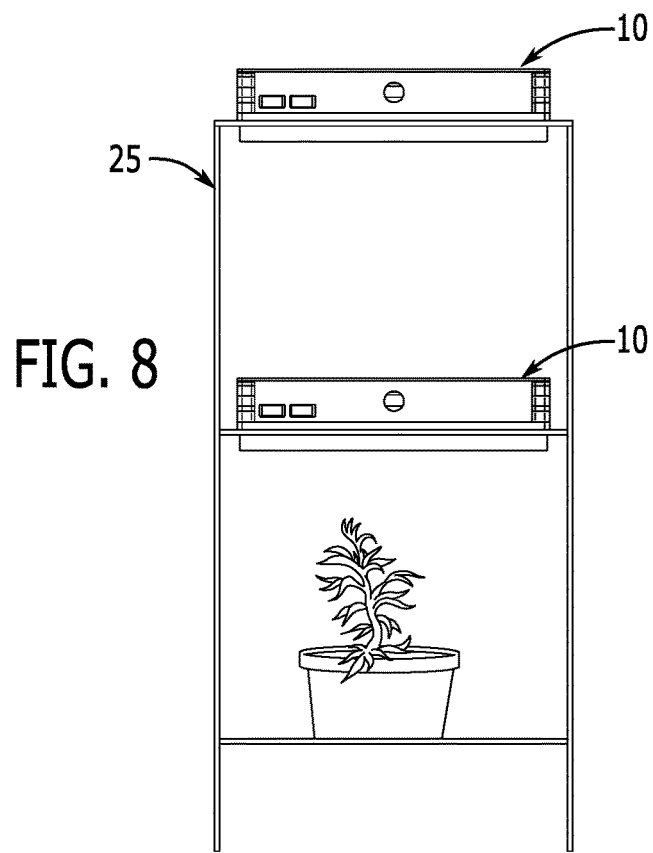
FIG. 8 shows a perspective view of one embodiment of the present invention shown in use.

Turning to FIG. 6 in more detail, a one quarter inch aluminum heat transfer plate is attached to the lower CPU mounting plate 21, which is made of copper. The one quarter inch aluminum heat transfer plate spreads heat from the lower CPU mounting plate 21 across a greater surface area to the bottom cover 12. A second heat transfer plate is configured to transfer heat from the computer's ram and SSD away from the RAM and SSD to an edge of the computer case with a spacer. The second heat transfer plate is also made from one quarter inch thick aluminum.

The base plate 20 spreads heat from the mounting plate 19 across a wide surface area and to a case edge. The base plate 20 is made from one eighth inch thick aluminum.

Figure 9:
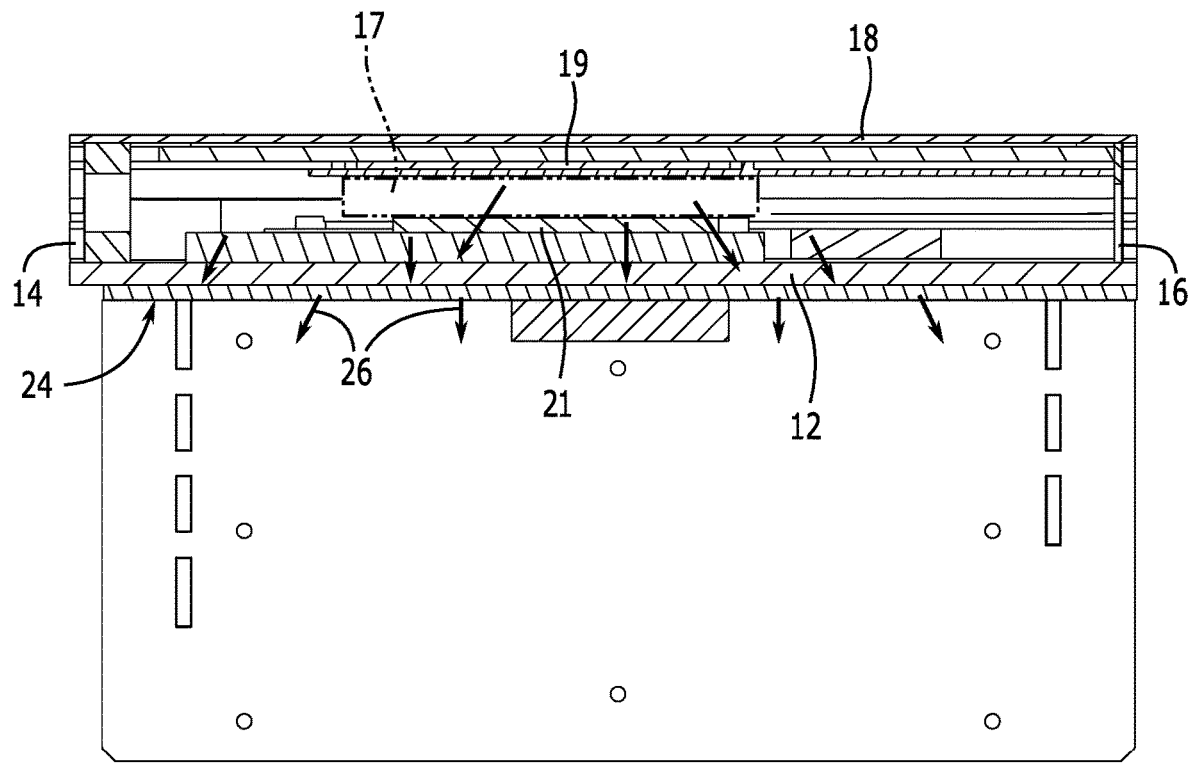
FIG. 9 shows a cross section view of one embodiment of the present invention taken along line 9-9 in FIG. 7.

The primary material considerations are that the material must have smooth flat side to allow heat to easily transfer to the next part or thermal accessory. Additionally, the material must have good thermal conductivity. Of the varieties of aluminum tested 5052 aluminum alloy works and 6063 aluminum alloy works better. 5052 aluminum alloy has thermal conductivity of 138 W/m*K, 6063 aluminum alloy has a thermal conductivity of 201-218 W/m*K. Copper alloy 110 has a thermal conductivity of 380 W/m*K Turning to FIGS. 7 and 8, the computer case 10 can be attached to on a desk 24 or a shelf 25 proximate a monitor 28, a keyboard 30. As shown in FIG. 9, heat 26 from the motherboard 17 and particularly the CPU, radiates from the computer case 10 through a thermal accessory such as the desk 24 or the shelf 25 into the atmosphere.

As used in this application, the term "a" or "an" means "at least one" or "one or more."

As used in this application, the term "about" or "approximately" refers to a range of values within plus or minus 10% of the specified number.

As used in this application, the term "substantially" means that the actual value is within about 10% of the actual desired value, particularly within about 5% of the actual desired value and especially within about 1% of the actual desired value of any variable, element or limit set forth herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Any element in a claim that does not explicitly state "means for" performing a specified function, or "step for" performing a specified function, is not to be interpreted as a "means" or "step" clause as specified in 35 U.S.C. § 112, ¶ 6. In particular, any use of "step of" in the claims is not intended to invoke the provision of 35 U.S.C. § 112, ¶ 6.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A fanless computer case assembly is configured to distribute heat from a computer through a thermal accessory; the fanless computer case assembly comprising:

a fanless computer case comprises a bottom cover joined to a front panel and a rear panel; a top cover is joined to the front panel and the rear panel a mother board further comprising a central processing unit, is arranged between the front panel and the rear panel;

an upper CPU mounting plate and a lower CPU mounting plate, joined to the central processing unit;

a base plate, attached to the upper CPU mounting plate and the top cover with a spacer creating an air gap between the base plate and the top cover;

a first heat transfer plate, attached to the lower CPU mounting plate and the bottom cover;

wherein heat from the central processing unit transfers through the lower CPU mounting plate, is spread across the first heat transfer plate through the bottom cover, and through the thermal accessory.

2. The fanless computer case assembly of claim 1, further comprising a second heat transfer plate, joined to the bottom cover with a spacer, and further connected to RAM and an SSD joined to the motherboard; wherein heat from the RAM and the SSD is transferred to the second heat transfer plate and through the thermal accessory.

3. The fanless computer case assembly of claim 2, wherein the thermal accessory is a desk attached to the fanless computer case.

4. The fanless computer case assembly of claim 2, wherein the thermal accessory is a shelf attached to the fanless computer case.

\* \* \* \* \*